United States Patent
Edelstein et al.

(10) Patent No.: US 9,972,672 B1
(45) Date of Patent: May 15, 2018

(54) TUNABLE RESISTOR WITH CURVED RESISTOR ELEMENTS

(71) Applicant: International Business Machines Corporation, Armonk, NY (US)

(72) Inventors: Daniel C. Edelstein, White Plains, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/403,971

(22) Filed: Jan. 11, 2017

(51) Int. Cl.
    *H01L 21/00* (2006.01)
    *H01L 49/02* (2006.01)
    (Continued)

(52) U.S. Cl.
    CPC .............. *H01L 28/24* (2013.01); *H01C 7/006* (2013.01); *H01C 17/075* (2013.01); *H01L 21/02183* (2013.01); *H01L 21/321* (2013.01); *H01L 21/32051* (2013.01); *H01L 21/7684* (2013.01); *H01L 21/76802* (2013.01);
    (Continued)

(58) Field of Classification Search
    CPC ......... H01L 21/02183; H01L 21/32051; H01L 21/321; H01L 21/76802; H01L 21/76823; H01L 21/76834; H01L 21/7684; H01L 21/76846; H01L 21/76877; H01L 23/5228; H01L 23/528; H01L 23/53238; H01L 23/5329; H01L 28/24; H01L 28/20; H01L 28/60; H01L 28/09; H01C 7/006; H01C 17/075; H01C 17/006; H01C 17/06; H01C 17/02; H01C 7/00; H01C 7/003
See application file for complete search history.

(56) References Cited

U.S. PATENT DOCUMENTS 5,410,913 A    5/1995   Blackburn
5,485,138 A    1/1996   Morris
     (Continued)

OTHER PUBLICATIONS

S.-M. NA, et al., "Electrical and structural properties of Ta—N thin film and Ta/Ta—N multilayer for embedded resistor", Thin Solid Films, Available online Jul. 13, 2007, pp. 5465-5469, 516.

(Continued)

*Primary Examiner* — Nikolay Yushin
(74) *Attorney, Agent, or Firm* — Scully, Scott, Murphy & Presser, P.C.; Steven J. Meyers (57) ABSTRACT

A resistor structure is provided that contains curved resistor elements. The resistor structure is embedded within an interconnect dielectric material and the resistivity of an electrical conducting resistive material of the resistor structure can be tuned to a desired resistivity during the manufacturing of the resistor structure. Notably, an electrical conducting metallic structure having a concave outermost surface is provided in a dielectric material layer. A doped metallic insulator layer is formed on the concave outermost surface of the metallic structure. A controlled surface treatment process is then performed to an upper portion of the doped metallic insulator layer to convert the upper portion of the doped metallic insulator layer into an electrical conducting resistive material. An interconnect dielectric material can then be formed to embed the entirety of the remaining doped metallic insulator layer and the electrical conducting resistive material.

12 Claims, 7 Drawing Sheets

(51) Int. Cl.
| | |
|---|---|
| *H01C 7/00* | (2006.01) |
| *H01C 17/075* | (2006.01) |
| *H01L 23/522* | (2006.01) |
| *H01L 23/532* | (2006.01) |
| *H01L 23/528* | (2006.01) |
| *H01L 21/3205* | (2006.01) |
| *H01L 21/768* | (2006.01) |
| *H01L 21/321* | (2006.01) |
| *H01L 21/02* | (2006.01) |

(52) U.S. Cl.
CPC .. *H01L 21/76823* (2013.01); *H01L 21/76834* (2013.01); *H01L 21/76846* (2013.01); *H01L 21/76877* (2013.01); *H01L 23/528* (2013.01); *H01L 23/5228* (2013.01); *H01L 23/5329* (2013.01); *H01L 23/53238* (2013.01)

(56) References Cited

U.S. PATENT DOCUMENTS

| | | | |
|---|---|---|---|
| 6,083,785 | A | 7/2000 | Segawa et al. |
| 6,207,560 | B1 | 3/2001 | Lee |
| 6,232,042 | B1 | 5/2001 | Dunn et al. |
| 6,433,429 | B1 * | 8/2002 | Stamper ............ H01L 21/76846 257/654 |
| 6,437,440 | B1 | 8/2002 | Cabral, Jr. et al. |
| 6,440,807 | B1 | 8/2002 | Ajmera et al. |
| 6,534,360 | B2 | 3/2003 | Narwankar et al. |
| 6,665,033 | B2 | 12/2003 | Callegari et al. |
| 6,951,804 | B2 | 10/2005 | Seutter et al. |
| 7,057,490 | B2 | 6/2006 | Hashimoto et al. |
| 7,314,786 | B1 | 1/2008 | Yang et al. |
| 7,345,503 | B2 | 3/2008 | Chen et al. |
| 7,928,006 | B2 * | 4/2011 | Besling ............ H01L 21/76823 257/E21.584 |
| 8,962,473 | B2 * | 2/2015 | Kuo .................. H01L 23/53238 257/751 |
| 2002/0146915 | A1 | 10/2002 | Narwankar et al. |
| 2004/0027234 | A1 | 2/2004 | Hashimoto et al. |
| 2006/0148253 | A1 * | 7/2006 | Chung .................... C23C 16/34 438/681 |
| 2008/0251921 | A1 * | 10/2008 | Besling ............ H01L 21/76823 257/751 |
| 2014/0264867 | A1 * | 9/2014 | Kuo .................. H01L 23/53238 257/751 |
| 2016/0020148 | A1 | 1/2016 | Song et al. |
| 2017/0154950 | A1 | 6/2017 | Basker et al. |

OTHER PUBLICATIONS

A. Scandurra, et al., "Tantalum nitride thin film resistors by low temperature reactive sputtering for plastic electronics", Surf. Interface Anal., Published online in Wiley Interscience: Feb. 20, 2008, pp. 758-762m, 40.

List of IBM Patents or Patent Applications Treated as Related Dated Jan. 11, 2017, 2 Pages.

Office Action dated Aug. 25, 2017 received in U.S. Appl. No. 15/403,946.

Office Action dated Sep. 22, 2017 received in U.S. Appl. No. 15/403,908.

Office Action dated Apr. 4, 2018 received in U.S. Appl. No. 15/799,435.

* cited by examiner

TUNABLE RESISTOR WITH CURVED RESISTOR ELEMENTS

BACKGROUND

The present application relates to a semiconductor structure and a method of forming the same. More particularly, the present application relates to a semiconductor structure that includes a tunable resistor structure that contains curved resistor elements. The present application also provides a method of forming such a semiconductor structure.

A resistor, which is a passive two-terminal electrical component that implements electrical resistance as a circuit element, is one of the most common electrical components present in almost every electrical device. In electronic circuits, resistors can be used to limit current flow, to adjust signal levels, bias active elements, and terminate transition lines.

In semiconductor devices, it is well known to have a thin film resistor such as, for example, a resistor composed of TaN, embedded in the chip through either a damascene approach or a subtractive etch method. For example, and during back-end-of-the-line (BEOL) processing, a thin film resistor may be embedded in an interconnect dielectric material. Prior art methods of forming thin film resistors embedded in an interconnect dielectric material are complicated and expensive. Moreover, topography issues arise when embedding a thin film resistor in an interconnect dielectric material which may degrade the final chip yield. Other issues with prior art methods of embedding a thin film metal resistor in a MOL dielectric material include variation of sheet resistivity and tuning precision.

There is thus a need for providing a semiconductor structure including a resistor structure that is embedded in an interconnect dielectric material that has design flexibility and controlled resistivity.

SUMMARY

The present application provides a resistor structure that contains curved resistor elements and is embedded within an interconnect dielectric material in which the resistivity of an electrical conducting resistive material of the resistor structure can be tuned to a desired resistivity during the manufacturing of the resistor structure. Notably, an electrical conducting metallic structure having a concave outermost surface is provided in a dielectric material layer. A doped metallic insulator layer is formed on the concave outermost surface of the metallic structure. A controlled surface treatment process is then performed to an upper portion of the doped metallic insulator layer to convert the upper portion of the doped metallic insulator layer into an electrical conducting resistive material. An interconnect dielectric material can then be formed to embed the entirety of the remaining doped metallic insulator layer and the electrical conducting resistive material.

In one aspect of the present application, a semiconductor structure containing a tunable resistor structure is provided. In one embodiment of the present application, the semiconductor structure includes an electrical conducting metallic structure having a concave outermost surface and embedded within a dielectric material layer. A curved resistor structure is located on the concave outermost surface of the electrical conducting metallic structure. The curved resistor structure includes, from bottom to top, a doped metallic insulator and an electrical conducting resistive material. An interconnect dielectric material entirely embeds the curved resistor structure.

In another aspect of the present application, a method of forming a semiconductor structure is provided. In one embodiment, the method may include providing an electrical conducting metallic structure having a concave outermost surface and embedded in a dielectric material layer. A doped metallic insulator layer is then formed on the concave outermost surface of the electrical conducting metallic structure. Next, a controlled surface treatment process is performed to an upper portion of the doped metallic insulator layer to convert the upper portion of the doped metallic insulator layer into an electrical conducting resistive material, wherein a remaining portion of doped metallic insulator layer and the electrical conducting resistive material provide a curved resistor structure. An interconnect dielectric material is then formed to embed the entirety of the curved resistor structure.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
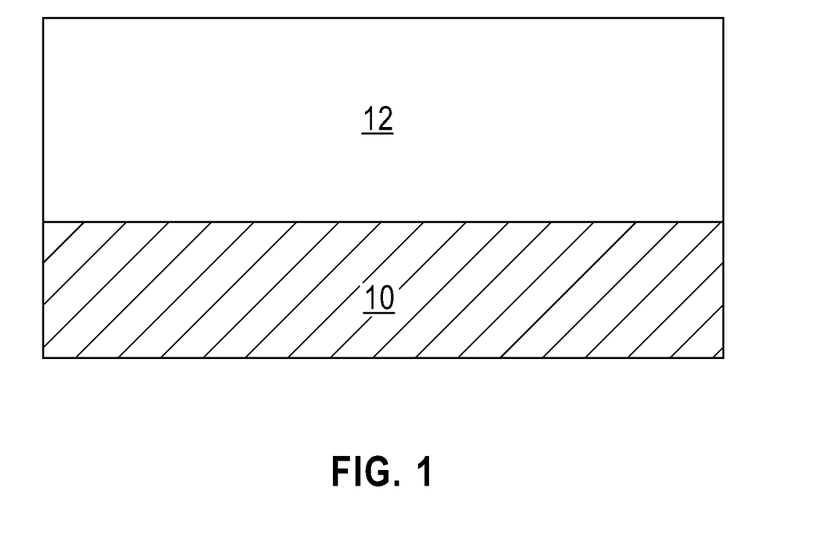
FIG. 1 is a cross sectional view of an exemplary semiconductor structure including a base substrate and a dielectric material layer that can be employed in accordance with an embodiment of the present application.

Referring first to FIG. 1, there is illustrated an exemplary semiconductor structure including a base substrate 10 and a dielectric material layer 12 that can be employed in accordance with an embodiment of the present application. As is shown, the dielectric material layer 12 is present on the entirety of the base substrate 10.

The base substrate 10 may be composed of a semiconductor material, an insulator material, a conductive material or any combination thereof. When the base substrate 10 is composed of a semiconductor material, any material having semiconducting properties such as, for example, Si, SiGe, SiGeC, SiC, Ge alloys, III/V compound semiconductors or II/VI compound semiconductors, may be used. In addition to these listed types of semiconductor materials, base substrate 10 can be a layered semiconductor such as, for example, Si/SiGe, Si/SiC, silicon-on-insulators (SOIs) or silicon germanium-on-insulators (SGOIs).

When the base substrate 10 is an insulator material, the insulator material can be an organic dielectric material, an inorganic dielectric material or any combination thereof including multilayers. The insulator material that may provide the base substrate 10 is typically, but not necessarily always, composed of a different dielectric material than the dielectric material layer 12. When base substrate 10 is a conductive material, base substrate 10 may include, for example, polySi, an elemental metal, alloys of elemental metals, a metal silicide, a metal nitride or any combination thereof including multilayers.

When base substrate 10 is composed of a semiconductor material, one or more semiconductor devices such as, for example, complementary metal oxide semiconductor (CMOS) devices can be fabricated thereon. When base substrate 10 is composed of a combination of an insulator material and a conductive material, base substrate 10 may represent an underlying interconnect level of a multilayered interconnect structure.

The dielectric material layer 12 may include any interlevel or intralevel dielectric material including inorganic dielectrics or organic dielectrics. A single interlevel or intralevel dielectric material may be used, or a multilayered dielectric material stack of at least two different interlevel or intralevel dielectrics may be used. In one embodiment, the dielectric material layer 12 may be non-porous. In another embodiment, the dielectric material layer 12 may be porous. Some examples of suitable dielectrics that can be used as the dielectric material layer 12 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material that provides the dielectric material layer 12 typically has a dielectric constant that is about 4.0 or less, with a dielectric constant of about 2.8 or less being more typical. All dielectric constants mentioned herein are relative to a vacuum, unless otherwise noted. These dielectric materials generally have a lower parasitic cross talk as compared with dielectric materials that have a higher dielectric constant than 4.0. The thickness of dielectric material that provides the dielectric material layer 12 may vary depending upon the type of dielectric material(s) used. In one example, the dielectric material that provides the dielectric material layer 12 may have a thickness from 50 nm to 1000 nm. Other thicknesses that are lesser than, or greater than, the aforementioned thickness range may also be employed in the present application for the thickness of the dielectric material that provides the dielectric material layer 12.

The dielectric material that provides the dielectric material layer 12 may be formed utilizing a deposition process such as, for example, chemical vapor deposition (CVD), plasma enhanced chemical vapor deposition (PECVD) or spin-on coating.

Figure 2:
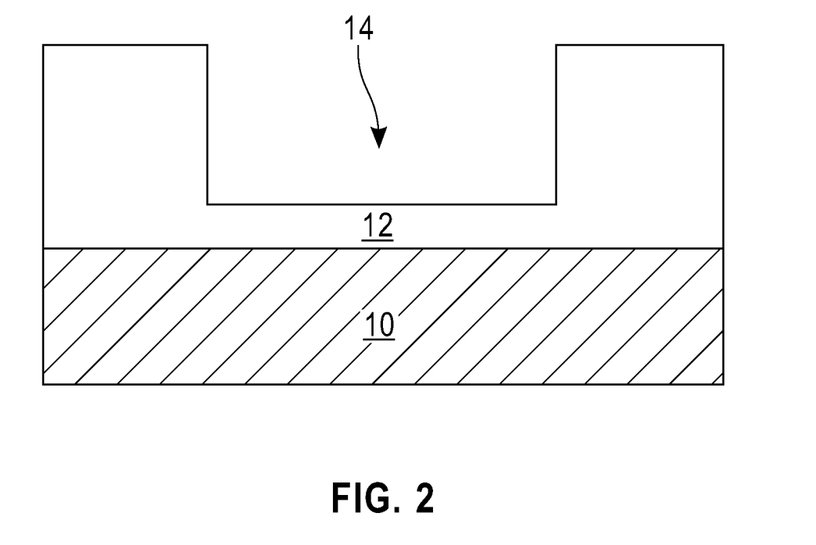
FIG. 2 is a cross sectional view of the exemplary semiconductor structure of FIG. 1 after forming an opening in the dielectric material layer.

Referring now to FIG. 2, there is illustrated the exemplary semiconductor structure of FIG. 1 after forming an opening 14 in the dielectric material layer 12. Although the present application describes and illustrates forming a single opening 14 into the dielectric material layer 12, a plurality of openings can be formed into the dielectric material layer 12.

The opening 14 can be formed utilizing a patterning process. In one embodiment, the patterning process may include lithography and etching. The lithographic process includes forming a photoresist (not shown) atop a material or material stack to be patterned, i.e., the dielectric material layer 12, exposing the photoresist to a desired pattern of radiation, and developing the exposed photoresist utilizing a conventional resist developer. The photoresist may be a positive-tone photoresist, a negative-tone photoresist or a hybrid-tone photoresist. The etching process includes a dry etching process (such as, for example, reactive ion etching, ion beam etching, plasma etching or laser ablation), and/or a wet chemical etching process. Typically, reactive ion etching is used in providing the opening 14 into the dielectric material layer 12. As is shown, the opening 14 stops within dielectric material layer 12 exposing a sub-surface portion of the dielectric material layer 12. By "sub-surface portion" it is meant a portion of a material that is located between a topmost surface and a bottommost surface of the material.

The opening 14 may be a via opening, a line opening, and/or a combined via/line opening. In one embodiment, and when a combined via/line opening is formed, a via opening can be formed first and then a line opening is formed atop and in communication with the via opening. In another embodiment, and when a combined via/line opening is formed, a line opening can be formed first and then a via opening is formed atop and in communication with the line opening. In FIG. 2, and by way of an example, the opening 14 is a via opening. When a combined via/line is formed a dual damascene process (including at least one iteration of the above mentioned lithography and etching steps) can be employed.

Figure 3:
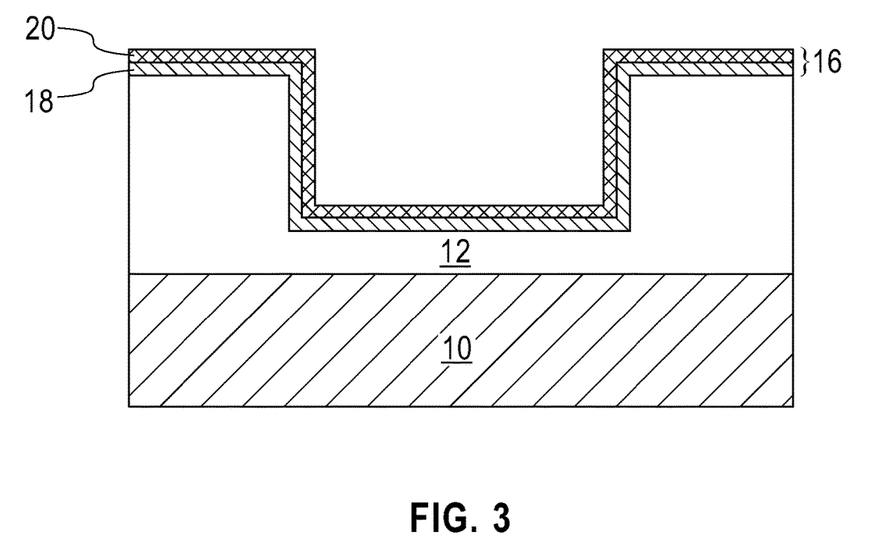
FIG. 3 is a cross sectional view of the exemplary semiconductor structure of FIG. 2 after forming a liner system including at least a metal liner within the opening and on a topmost surface of the dielectric material layer.

Referring now to FIG. 3, there is illustrated the exemplary semiconductor structure of FIG. 2 after forming a liner system 16 including at least a metal liner 20 within the opening 14 and on a topmost surface of the dielectric material layer 12. The liner system may also include an optional diffusion barrier liner 18.

The metal that provides the metal liner 20 must be different from the metal or metal alloy that provides the subsequently formed layer of metal or metal alloy 22 (see, for example, FIG. 4). The metal for the metal liner 20 is chosen to provide a galvanic reaction to a subsequently formed layer of metal or metal alloy 22. The term "galvanic reaction" denotes the process by which two dissimilar metals (i.e., the metal liner and the subsequently formed layer of metal or metal alloy) that are in contact with each other begin to oxide or corrode. It is noted that for a galvanic reaction to occur the following three conditions need to meet. First, there must be two electrochemical dissimilar metals present (in the present case the metal liner differs from the layer of metal or metal alloy to be subsequently formed). Second, there must be an electrically conductive path between the more anodic metal to the more cathodic metal (in the present application and during a subsequently performed planarization process there is an electrically conductive path between the metal liner and the layer of metal or metal alloy to be subsequently formed). Third, there must be a conductive path for the metal ions to moved from the more anodic metal to the more cathodic metal (in the present application and during a subsequently performed planarization process there is a electrically conductive path between the metal liner and the layer of metal or metal alloy to be subsequently formed).

In the present application, the metal liner 20 is chosen to provide a positive, i.e., faster, galvanic reaction to the subsequently formed layer of metal or metal alloy 22. The metal liner 20 that provides the positive galvanic reaction to the subsequently formed layer of metal or metal alloy 22 will be employed to provide an electrical conducting metallic structure having a concave outermost surface.

In the present application, the metal liner 20 is composed of a metal that is more noble (slower oxidation rate) than the metal or metal alloy of the layer of metal or metal alloy 22 to be subsequently formed. In one example, and when copper (Cu) is used as the layer of metal or metal alloy 22, ruthenium (Ru) can be used as the metal liner 20.

The metal liner 20 can be formed as a continuous layer utilizing a deposition process including, for example, chemical vapor deposition (CVD), plasma enhanced chemical vapor deposition (PECVD), atomic layer deposition (ALD), physical vapor deposition (PVD), sputtering, chemical solution deposition or plating. The metal liner 20 may have a thickness from 1 nm to 50 nm; although other thicknesses for the metal liner are contemplated and can be employed in the present application so long as the opening 14 is not entirely filled with the metal liner 20.

In some embodiments, the metal liner 20 is a sole component of the liner system 16. In such an embodiment, the metal liner 20 directly contacts exposed surfaces of the dielectric material layer 12.

In yet other embodiments, a diffusion barrier liner 18 can be positioned between the metal liner 20 and the dielectric material layer 12. FIG. 3 illustrates an embodiment in which the diffusion barrier liner 18 is present. When the diffusion barrier liner 18 is present, the diffusion barrier liner 18 represents a lower liner material of the liner system 16, while the metal liner 20 represents an upper liner material of the liner system 16.

When present, the diffusion barrier liner 18 is composed of a diffusion barrier material. The diffusion barrier material that may provide the diffusion barrier liner 18 includes Ta, TaN, Ti, TiN, Ru, RuN, RuTa, RuTaN, W, WN, Co, CoN or any other material that can serve as a barrier to prevent a metal or metal alloy to be subsequently formed from diffusing there through. In some embodiments, the diffusion barrier material that may provide the diffusion barrier liner 18 may have a thickness from 1 nm to 50 nm; although other thicknesses for the diffusion barrier material are contemplated and can be employed in the present application so long as the entirety of the opening 14 is not filled with a diffusion barrier material.

The diffusion barrier material that may provide the diffusion barrier liner 18 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

Figure 4:
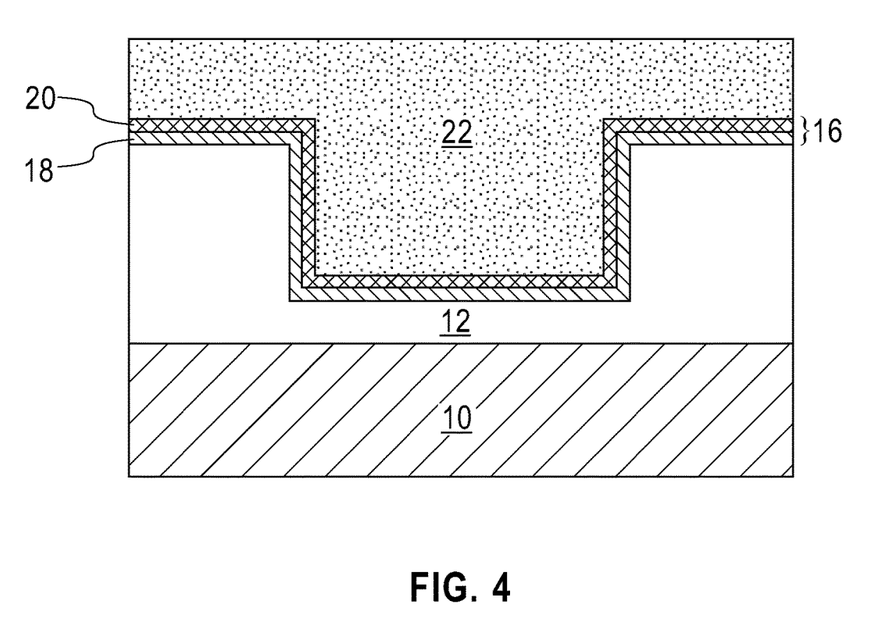
FIG. 4 is a cross sectional view of the exemplary semiconductor structure of FIG. 3 after forming a layer of a metal or metal alloy on the metal liner, wherein the metal or metal alloy of the layer of metal or metal alloy differs from the metal of the metal liner.

Referring now to FIG. 4, there is illustrated the exemplary semiconductor structure of FIG. 3 after forming a layer of a metal or metal alloy 22 on the metal liner 20, wherein the metal or metal alloy of the layer of metal or metal alloy 22 differs from the metal of the metal liner 20.

The metal or metal alloy that provides the layer of metal or metal alloy 22 must be different from the metal used for the metal liner 20 such that a galvanic reaction is possible. Also, the metal or metal alloy that provides the layer of metal or metal alloy must provide a negative, i.e., slower, galvanic reaction as compared to the metal liner 20. The metal or metal alloy that provides the layer of metal or metal alloy 22 may include tantalum (Ta), tungsten (W), cobalt (Co), rhodium (Rh), ruthenium (Ru), aluminum (Al), copper (Cu), iridium (Ir), nickel (Ni) or alloys thereof. In one embodiment, the metal or metal alloy that provides the layer of metal or metal alloy 22 is composed of copper or a copper alloy.

The metal or metal alloy that provides the layer of metal or metal alloy 22 can be formed utilizing a deposition process such as, for example, chemical vapor deposition (CVD), plasma enhanced chemical vapor deposition (PECVD), sputtering, chemical solution deposition or plating. In one embodiment, a bottom-up plating process is employed in forming the metal or metal alloy that provides the layer of metal or metal alloy 22.

As is shown in FIG. 4, the layer of metal or metal alloy 22 fills in the remaining volume of the opening 14 and includes an upper portion (also referred to as an overburden portion) that extends outside the opening 14 and above the topmost surface of the dielectric material layer 12.

Figure 5:
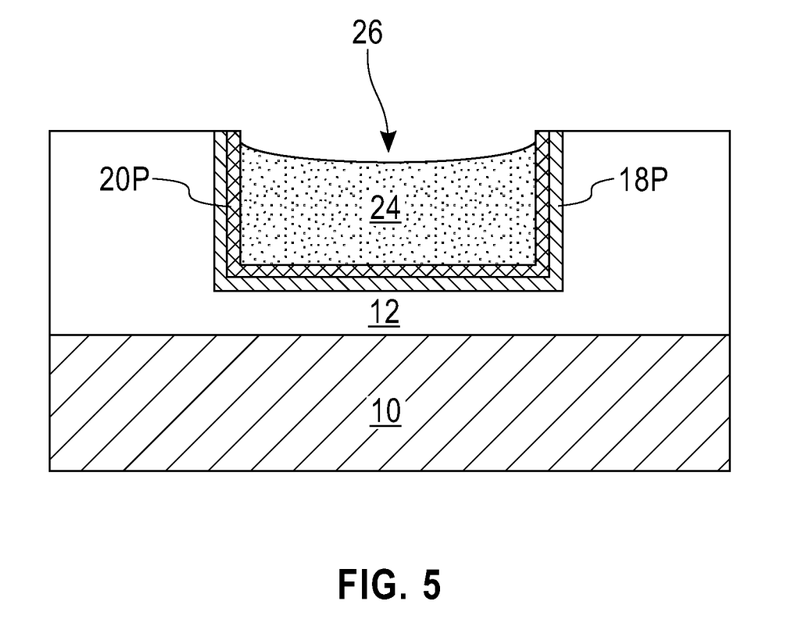
FIG. 5 is a cross sectional view of the exemplary semiconductor structure of FIG. 4 after performing a planarization process in which an electrical conducting metallic structure having a concave outermost surface is provided.

Referring now FIG. 5, there is shown the exemplary semiconductor structure of FIG. 4 after performing a planarization process in which an electrical conducting metallic structure 24 having a concave outermost surface 26 is provided. The term "concave" denotes a metal in which an upper portion thereof bulges inward.

The planarization process removes a portion of layer of metal or metal alloy 22, and a portion of the liner system 16, while leaving a portion of the layer of metal or metal alloy 22, and a portion of the liner system 16 embedded within the opening 14. The planarization process completely removes the layer of metal or metal alloy 22 and the liner system 16 from atop the dielectric material layer 12.

The electrical conducting metallic structure 24 constitutes a remaining portion of the layer of metal or metal alloy 22. The remaining portion of diffusion barrier liner 18 can be referred to herein as a U-shaped diffusion barrier liner 18P, and the remaining portion of the metal liner 20 may be referred to herein as a U-shaped metal liner 20P. By "U-shaped" it is meant a material that contains a horizontal portion and two vertical portions that extend upward from opposing ends of the horizontal portion. Thus, and after planarization, the liner system 16 can now be referred to as a U-shaped liner system.

In some embodiments (not shown), a recess etch may be performed prior to planarization to remove a portion of the overburden portion of the layer of metal or metal alloy 22. During the recess etch, no galvanic reaction occurs.

In the present application, chemical mechanical polishing (CMP) is used as the planarization process to provide the structure shown in FIG. 5; the term 'chemical mechanical planarization' can be used interchangeably with the term 'chemical mechanical polishing'. CMP is a process of smoothing surfaces with the combination of chemical and mechanical forces.

Because the metal liner 20 is dissimilar to the layer of metal or metal alloy 22, a different removal rate occurs during the planarization which facilitates the formation of the electrical conducting metallic structure 24 having the concave outermost surface 26. For example, and in the embodiment in which Ru is employed as the metal liner 20 and Cu is employed as the layer of metal or metal alloy 22, and since Ru is more noble than Cu, the Ru removal rate during the planarization process is less than the removal rate of Cu, thus the electrical conducting metallic structure 24 having the concave outermost surface 26 is formed.

Figure 6:
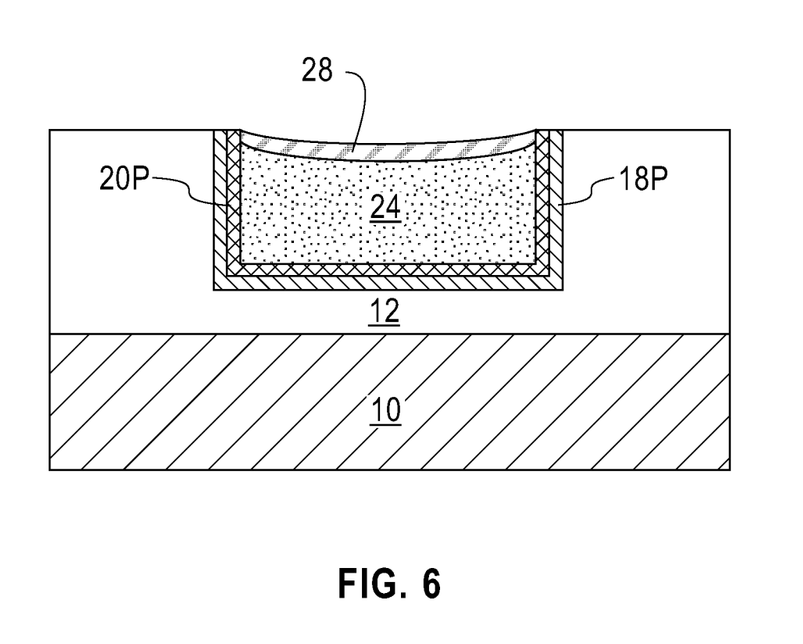
FIG. 6 is a cross sectional view of the exemplary semiconductor structure of FIG. 5 after forming a doped metallic insulator layer on the concave outermost surface of the electrical conducting metallic structure.

Referring to FIG. 6, there is illustrated the exemplary semiconductor structure of FIG. 5 after forming a doped metallic insulator layer 28 on the concave outermost surface 26 of the electrical conducting metallic structure 24. A portion of the doped metallic insulator layer 28 may extend onto the U-shaped liner system (18P and/or 20P). In one embodiment, the doped metallic insulator layer 28 is formed only upon the electrical conducting metallic structure 24. In yet another embodiment, the doped metallic insulator layer 28 is formed upon the electrical conducting metallic structure 24 and the U-shaped metal liner 20P. In yet another embodiment, the doped metallic insulator layer 28 is formed on the electrical conducting metallic structure 24, the U-shaped metal liner 20P and the U-shaped diffusion barrier liner 18P.

Doped metallic insulator layer 28 is a continuous (without any voids and/or breaks) layer. In one embodiment, doped metallic insulator layer 28 may include a nitrogen-doped metal that is composed of nitrogen, N, and a metal, M. In another embodiment, doped metallic insulator layer 28 may include an oxygen-doped metal that is composed of oxygen, O, and a metal, M. In yet another embodiment, doped metallic insulator layer 28 may include a nitrogen- and oxygen-doped metal that is composed of nitrogen, N, oxygen, O, and a metal M. In any of the above mentioned embodiments, metal, M, is a ohmic material such as, for example, titanium (Ti), tantalum (Ta), ruthenium (Ru), tungsten (W), platinum (Pt), cobalt (Co), rhodium (Rh) and manganese (Mn). In one example, the doped metallic insulator layer 28 is $Ta_3N_5$. In any of the above mentioned embodiments, the ratio of nitrogen and/or oxygen to metal in the doped metallic insulator layer 28 provides a crystal structure having an insulating phase, which upon performing a subsequent controlled surface treatment is converted into an electrical conducting phase.

Doped metallic insulator layer 28 may be formed utilizing a selective deposition process such as, for example, chemical vapor deposition (CVD), plasma enhanced chemical vapor deposition (PECVD), atomic layer deposition (ALD), and electroless plating.

Doped metallic insulator layer 28 may have a thickness of from 5 nm to 50 nm. Other thicknesses that are lesser than 5 nm, or greater than 50 nm can also be employed as the thickness of the doped metallic insulator layer 28.

Figure 7:
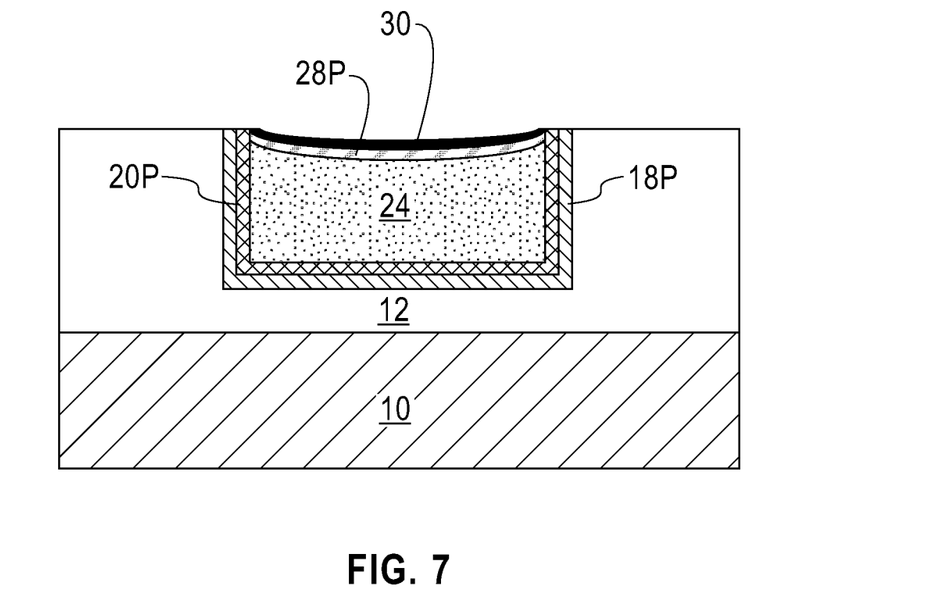
FIG. 7 is cross sectional view of the exemplary semiconductor structure of FIG. 6 after performing a controlled surface treatment in which an upper portion of the doped metallic insulator layer is converted into an electrical conducting metallic nitride and/or oxide, wherein the remaining portion of the doped metallic insulator layer and the electrical conducting metallic nitride and/or oxide provide a resistor structure with curved resistor elements.

Referring now to FIG. 7, there is illustrated the exemplary semiconductor structure of FIG. 6 after performing a controlled surface treatment in which an upper portion of the doped metallic insulator layer 28 is converted into an electrical conducting metallic nitride and/or oxide 30, wherein the remaining portion of the doped metallic insulator layer (hereinafter the doped metallic insulator 28P) and the electrical conducting metallic nitride and/or oxide 30 provide a resistor structure with curved resistor elements. Stated in another terms, the remaining portion of the doped metallic insulator layer (hereinafter the doped metallic insulator 28P) and the electrical conducting metallic nitride and/or oxide 30 provide a curved resistor structure. The curved resistor structure follows the contour of the concave outermost surface of the electrical conducting metallic structure 24.

The term "metallic nitride and/or oxide" denotes a metallic nitride, a metallic oxide, or a metallic nitride-oxide. The electrical conducting metallic nitride and/or oxide 30 includes the same metal as the doped metallic insulator layer 28. In one example, the electrical conducting metallic nitride and/or oxide 30 is TaN. The electrical conductive metallic nitride and/or oxide 30 may also be referred to herein as an electrical conducting resistive material.

The controlled surface treatment process may include introducing atoms of nitrogen ($N_2$), atoms of oxygen ($O_2$), atoms of hydrogen ($H_2$), atoms of argon (Ar) or any combination of the aforementioned atoms into the upper portion of the doped metallic insulator layer 28 such that the insulating phase of the exposed portion of the doped metallic insulator layer 28 is converted into a crystal structure having an electrical conducting phase. In one embodiment, after the controlled surface treatment process, the ratio of oxygen and/or nitrogen in the upper portion of the doped metallic insulator layer 28 is changed such that the upper portion of the doped metallic insulator layer 28 is converted from insulating to conducting. In one example, the doped metallic insulator layer 28 (and thus the doped metallic insulator 28P) is $Ta_3N_5$, and the resulting electrical conducting resistive material (i.e., the electrical conducting nitride and/or oxide 30) is TaN.

The controlled surface treatment process changes the composition of the exposed upper portion of the doped metallic insulator layer 28 into an electrical conducting metallic material. Tuning of the resistivity of the resultant electrical conducting metallic material, i.e., the electrical conducting metallic nitride and/or oxide 30, can be achieved by adjusting the depth of the controlled surface treatment process. In one embodiment of the present application, the controlled surface treatment converts from 1 nm to 3 nm of the doped metallic insulator layer 28 into the electrical conducting resistive material. Other depths are possible as long as at least a portion of the doped metallic insulator layer 28 remains after the controlled surface treatment process. As stated above, the remaining portion of the doped metallic insulator layer 28 can be referred to as a doped metallic insulator 28P.

The controlled surface treatment may include, but is not limited to, a thermal process, a plasma process, a gas cluster ion beam process, an ion beam process or an ion implantation process.

The thermal process may include thermal treatments in an ambient containing at least one of nitrogen ($N_2$), oxygen ($O_2$), hydrogen ($H_2$), and argon (Ar). In one example, the thermal treatments may include a thermal nitridation, and/or a thermal oxidation. The thermal processes do not include an electrical bias higher than 200 W. The thermal processes may include a laser beam treatment. In some embodiments, no electrical bias is performed during the thermal processes.

In one example, and when a thermal nitridation process is employed, the thermal nitridation process can be performed in any nitrogen-containing ambient, which is not in the form of a plasma. The nitrogen-containing ambients that can be employed in the present application include, but are not limited to, $N_2$, $NH_3$, $NH_4$, NO, or $NH_x$ wherein x is between 0 and 1. Mixtures of the aforementioned nitrogen-containing ambients can also be employed in the present application. In some embodiments, the nitrogen-containing ambient is used neat, i.e., non-diluted. In other embodiments, the nitrogen-containing ambient can be diluted with an inert gas such as, for example, helium (He), neon (Ne), argon (Ar) and mixtures thereof. In some embodiments, hydrogen ($H_2$) can be used to dilute the nitrogen-containing ambient.

In another example, and when a thermal oxidation process is employed, the thermal oxidation process can be performed in any oxygen-containing ambient, which is not in the form of a plasma. In one example, ozone ($O_3$) is employed as the oxygen-containing ambient. Other oxygen containing ambients may also be employed. Mixtures of the aforementioned oxygen-containing ambients can also be employed in the present application. In some embodiments, the oxygen-containing ambient is used neat, i.e., non-diluted. In other embodiments, the oxygen-containing ambient can be diluted with an inert gas such as, for example, helium (He), neon (Ne), argon (Ar) and mixtures thereof. In some embodiments, hydrogen ($H_2$) can be used to dilute the oxygen-containing ambient.

When a combined thermal nitridation and oxidation process is employed, a combination of nitrogen-containing and oxygen containing ambients used neat or admixed with an inert gas or hydrogen can be employed.

In the specific examples mentioned above (i.e., thermal oxidation and/or thermal nitridation), the content of nitrogen ($N_2$) and/or oxygen ($O_2$) within the ambient employed in the present application is typically from 10% to 100%, with a nitrogen and/or oxygen content within the ambient from 50% to 80% being more typical. In one embodiment, the thermal processes employed in the present application is performed at a temperature from 50° C. to 600° C.

Hydrogen ($H_2$) or argon (Ar) thermal processes can be performed neat or diluted and the amounts of hydrogen ($H_2$) or argon (Ar) in such thermal processes can also be in the range from 10% to 100%.

When a plasma process is used, an electrical bias of greater than 200 W can be employed. The plasma process is performed by generating a plasma from one of the ambients (neat or diluted) that are mentioned above for the thermal process; notably a plasma containing at least one of nitrogen ($N_2$), oxygen ($O_2$), hydrogen ($H_2$), and argon (Ar) is provided and used during the controlled surface treatment process. In one embodiment, the plasma process employed in the present application is performed at a temperature from 50° C. to 600° C.

When an ion beam process is employed, a beam of at least one of nitrogen ($N_2$) ions, oxygen ($O_2$) ions, hydrogen ($H_2$) ions, and argon (Ar) ions generated from an ion source such as one of the aforementioned ambients is impinged upon the doped metallic insulator layer 28. The ion beam process may be performed utilizing any ion beam apparatus. The energy of the ion beam process can from 10 eV to 100 eV. The ion beam process can be performed at a temperature from 50° C. to 600° C.

When a gas cluster ion beam process is employed, a cluster of at least one of nitrogen ($N_2$) ions, oxygen ($O_2$) ions, hydrogen ($H_2$) ions, and argon (Ar) ions generated from an ion source such as one of the aforementioned ambients is impinged upon the doped metallic insulator layer 28. The gas cluster ion beam process may be performed utilizing any gas cluster ion beam apparatus. The energy of the gas cluster ion beam process can from 10 eV to 30 eV. The gas cluster ion beam process can be performed at a temperature from 50° C. to 600° C.

When ion implantation is employed, at least one of nitrogen ($N_2$) ions, oxygen ($O_2$) ions, hydrogen ($H_2$) ions, and argon (Ar) ions generated from an ion source such as one of the aforementioned ambients are impinged upon the doped metallic insulator layer 28. The ion implantation process may be performed utilizing any ion implantation apparatus. The energy of the ion implantation process can from 10 eV to 200 eV. The ion implantation process can be performed at a temperature from 50° C. to 600° C.

Figure 8:
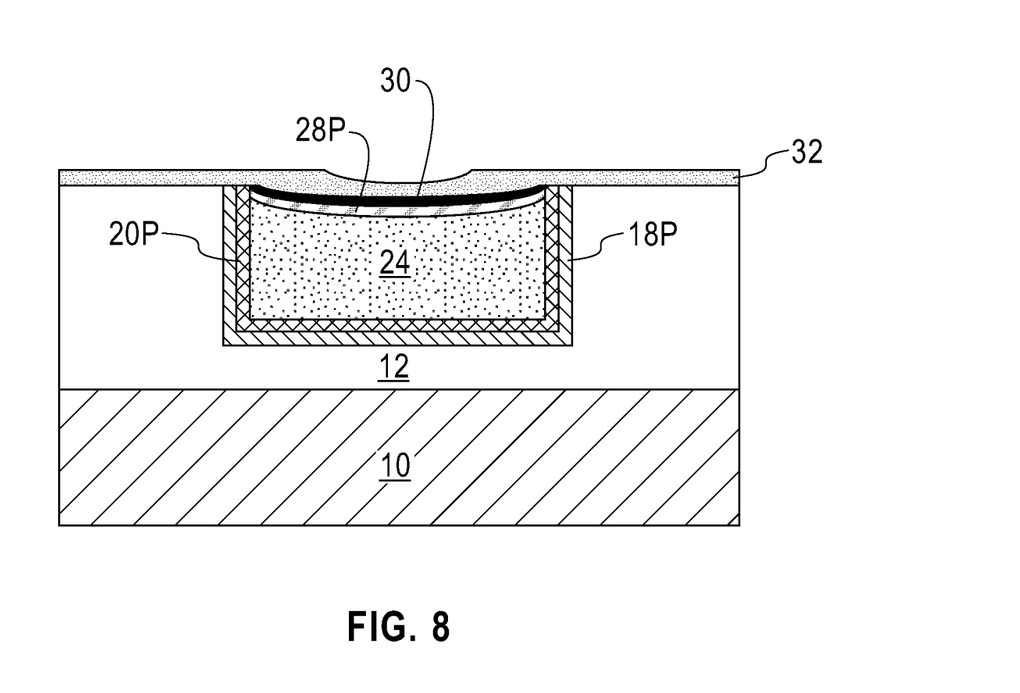
FIG. 8 is a cross sectional view of the exemplary semiconductor structure of FIG. 7 after forming a dielectric capping layer on physically exposed surfaces of the liner system, the resistor structure, and the dielectric material layer.

Referring now to FIG. 8, there is illustrated the exemplary semiconductor structure of FIG. 7 after forming a dielectric capping layer 32 on physically exposed surfaces of the U-shaped liner system (16P and/or 18P), the resistor structure (28P/30), and the dielectric material layer 12. In some embodiments, the formation of the dielectric capping layer 32 may be omitted.

When present, the dielectric capping layer 32 may include any dielectric capping material such as, for example, silicon carbide (Si), silicon nitride ($Si_3N_4$), silicon dioxide ($SiO_2$), a carbon doped oxide, a nitrogen and hydrogen doped silicon carbide (SiC(N,H)) or a multilayered stack of at least one of the aforementioned dielectric capping materials. The dielectric capping material that provides the dielectric capping layer 32 may be formed utilizing a deposition process such as, for example, chemical vapor deposition (CVD), plasma enhanced chemical vapor deposition (PECVD), atomic layer deposition (ALD), chemical solution deposition or evaporation.

When present, dielectric capping layer 32 may have a thickness from 10 nm to 100 nm. Other thicknesses that are lesser than 10 nm, or greater than 100 nm may also be used as the thickness of the dielectric capping layer 32.

Figure 9:
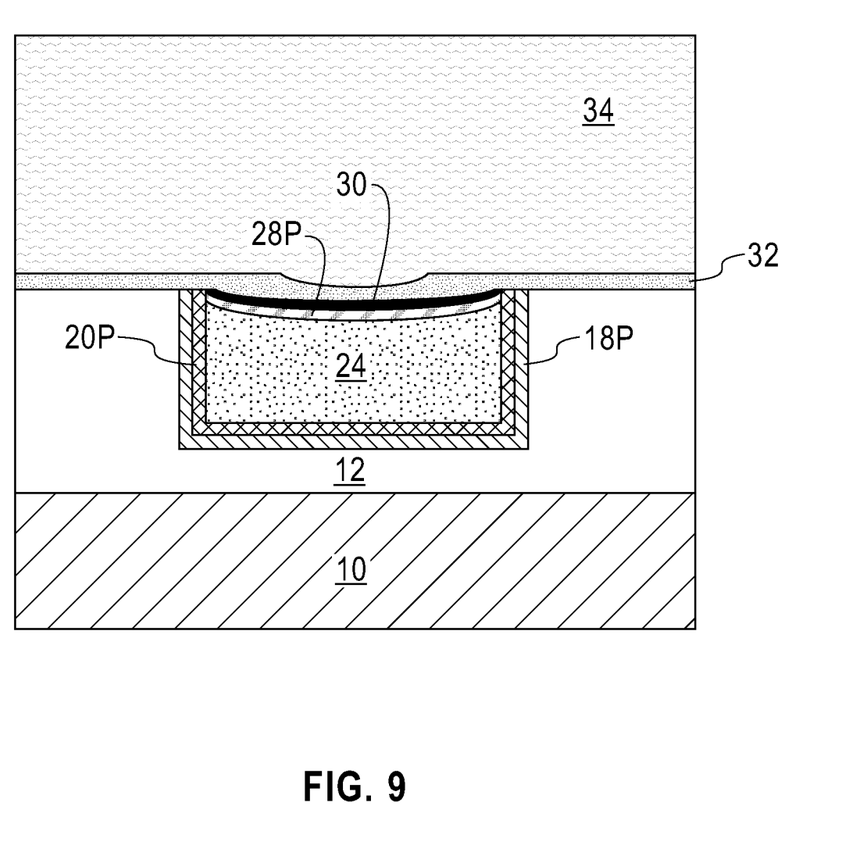
FIG. 9 is a cross sectional view of the exemplary semiconductor structure of FIG. 10 after forming an interconnect dielectric material on the dielectric capping layer.

Referring now to FIG. 9, there is illustrated the exemplary semiconductor structure of FIG. 10 after forming an interconnect dielectric material 34 on the dielectric capping layer 32. In embodiments in which the dielectric capping layer 32 is omitted, the interconnect dielectric material 34 may be formed on physically exposed surfaces of the U-shaped liner system (16P and/or 18P), the resistor structure (28P/30), and the dielectric material layer 12.

The interconnect dielectric material 34 may be composed of an inorganic dielectric material or an organic dielectric material. The interconnect dielectric material 34 comprises a different dielectric material than the dielectric capping layer 32. In some embodiments, the interconnect dielectric material 34 may be composed of a same dielectric material as the dielectric material layer 12. In yet other embodiments, the interconnect dielectric material 34 is composed of a different dielectric material than the dielectric material layer 12.

In some embodiments, the interconnect dielectric material 34 may be porous. In other embodiments, the interconnect dielectric material 34 may be non-porous. Examples of suitable dielectric materials that may be employed as the interconnect dielectric material 34 include, but are limited to, silicon dioxide, undoped or doped silicate glass, silsesquioxanes, C doped oxides (i.e., organosilicates) that include atoms of Si, C, O and H, theremosetting polyarylene ethers or any multilayered combination thereof.

The interconnect dielectric material 34 may have a dielectric constant (all dielectric constants mentioned herein are measured relative to a vacuum, unless otherwise stated) that is about 4.0 or less. In one embodiment, the interconnect dielectric material 34 has a dielectric constant of 2.8 or less. These dielectrics generally having a lower parasitic cross talk as compared to dielectric materials whose dielectric constant is greater than 4.0.

The interconnect dielectric material 34 may be formed by a deposition process such as, for example, chemical vapor deposition (CVD), plasma enhanced chemical vapor deposition (PECVD) or spin-on coating. The interconnect dielectric material 34 may have a thickness from 50 nm to 250 nm. Other thicknesses that are lesser than 50 nm, and greater than 250 nm can also be employed as long as the interconnect dielectric material 34 entirely embeds the resistor structure (28P/30) provided above. That is, the interconnect dielectric material 34 must cover the entire resistor structure (28P/30).

Figure 10:
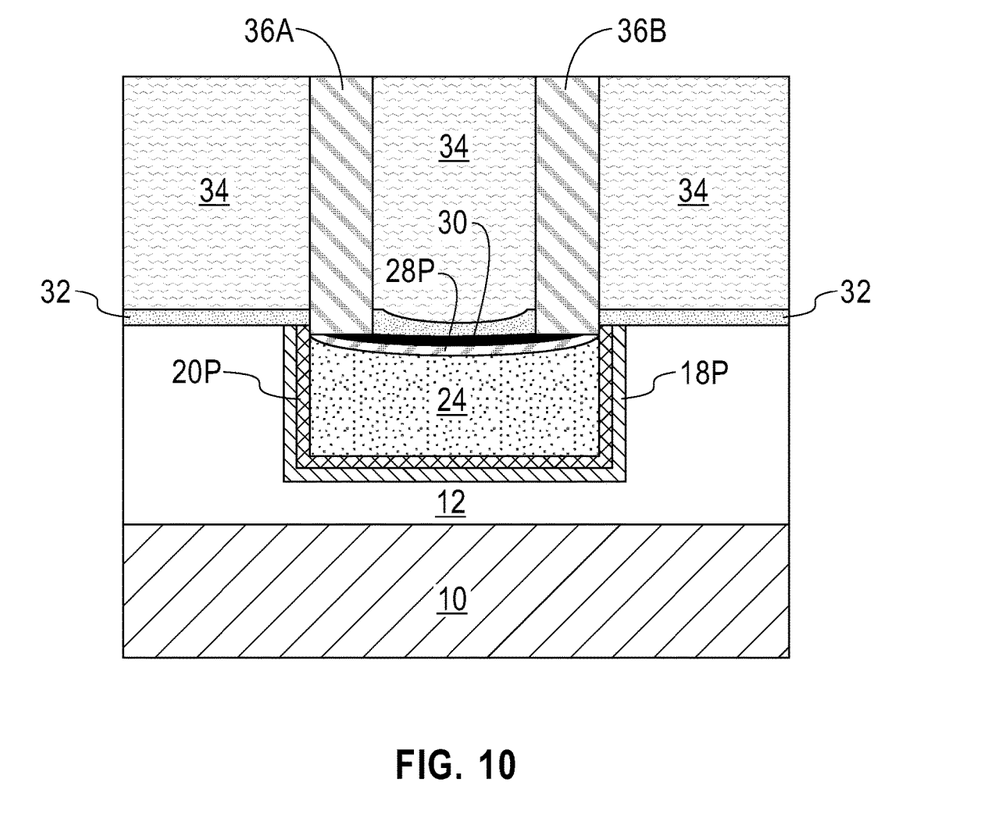
FIG. 10 is a cross sectional view of the exemplary semiconductor structure of FIG. 9 after forming a first contact structure that contacts a first portion of the resistor structure, and a second contact structure that contacts a second portion of the resistor structure.

Referring now to FIG. 10, there is illustrated the exemplary semiconductor structure of FIG. 9 after forming a first contact structure 36A that contacts a first portion of the resistor structure (28P/30), and a second contact structure 36B that contacts a second portion of the resistor structure (28P/30). The first contact structure 36A and the second contact structure 26B are spaced apart from each other. The contact structures 36A, 36B make electrical contact with the doped metallic insulator 28P and the electrically conductive resistive element 30 of the resistor structure.

Each contact structures (36A, 36B) can be formed by first providing contact openings into the interconnect dielectric material 34 and, if present, the dielectric capping layer 32. The contact openings physically expose different portions of resistor structure (28P/30). Each contact opening may be formed by lithography and etching as defined above. After providing the contact openings, each contact opening is then filled, at least in part, with a contact metal or metal alloy. The contact metal or metal alloy that provides at least a portion of the contact structures (36A, 36B) may include tungsten (W), cobalt (Co), aluminum (Al), copper (Cu), or a copper-aluminum alloy (in such an alloy copper may compose a majority (i.e., greater than 50 atomic percent) of the alloy, aluminum may compose a majority (i.e., greater than 50 atomic percent) of the alloy, or copper and aluminum are present in equal amounts (i.e., both elements are present at 50 atomic percent)).

The contact metal or metal alloy that provides at least a portion of the contact structures (36A, 36B) can be formed by a deposition process such as, for example, chemical vapor deposition (CVD), plasma enhanced chemical vapor deposition (PECVD), sputtering or plating. In some embodiments, a planarization process may follow the deposition of the contact metal or metal alloy. In the illustrated embodiment, the contact structures (36A, 36B) have a topmost surface that is coplanar with each as well as being coplanar with a topmost surface of the interconnect dielectric material 34.

Figure 11:
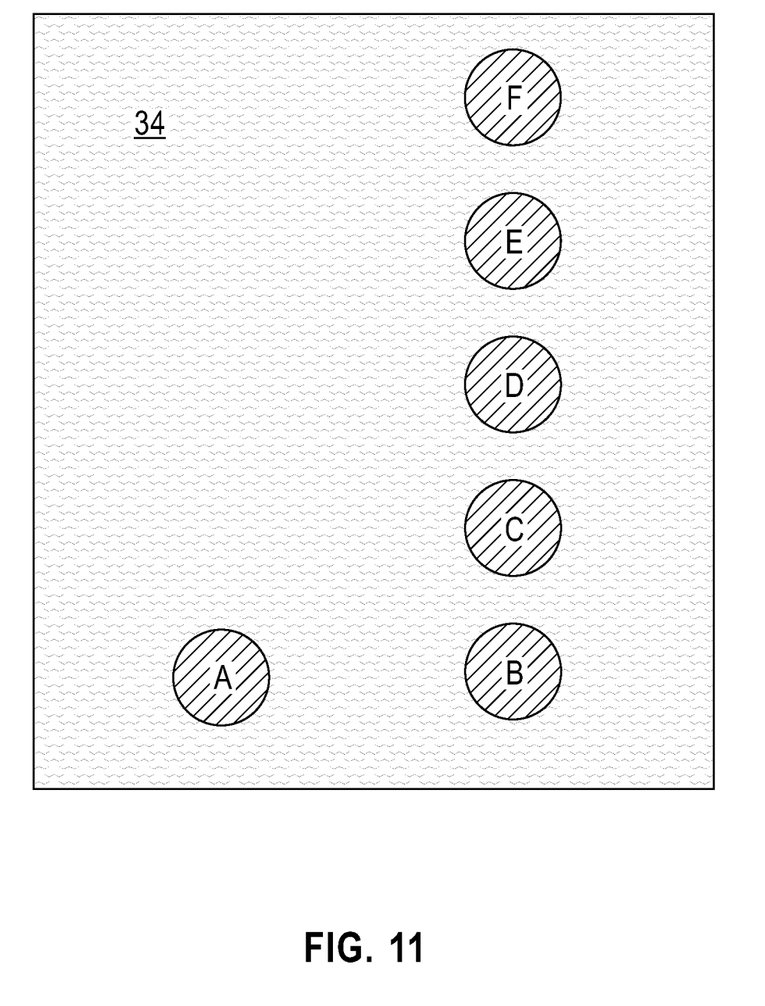
FIG. 11 is a top down view of the exemplary semiconductor structure of FIG. 9 after forming an array of contact structures which can provide a different resistance to the resistor structure of the present application.

Referring now to FIG. 11, there is illustrated the exemplary semiconductor structure of FIG. 9 after forming an array of contact structures which can provide a different resistance to the resistor structure of the present application. In this drawing, elements A, B, C, D, E and F represent contact structures that can be formed as described above. By varying the distance between the contact structures, it is possible to provide different resistance to the resistor structure. In this illustrated embodiment, the resistance is as follows: AB<AC<AE<AF.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:

providing an electrical conducting metallic structure having a concave outermost surface and embedded in a dielectric material layer;

forming a doped metallic insulator layer on the concave outermost surface of the electrical conducting metallic structure;

performing a controlled surface treatment process to an upper portion of the doped metallic insulator layer to convert the upper portion of the doped metallic insulator layer into an electrical conducting resistive material, wherein a remaining portion of doped metallic insulator layer and the electrical conducting resistive material provide a curved resistor structure; and forming an interconnect dielectric material to embed the entirety of the curved resistor structure, wherein the providing the electrical conducting metallic structure having the concave outermost surface comprises forming an opening in the dielectric material layer, forming a liner system including at least a metal liner in the opening and on an exposed surface of the dielectric material layer, forming a layer of a metal or metal alloy on the metal liner, wherein the metal liner is composed of a metal that has a positive galvanic reaction to a metal or metal alloy that provides the layer of metal or metal alloy, and performing a planarization process.

2. The method of claim 1, wherein the electrical conductive resistive material is selected from the group consisting of a metallic nitride, a metallic oxide, and a metallic nitride-oxide.

3. The method of claim 1, wherein the doped metallic insulator layer is selected from a nitrogen doped metal, an oxygen doped metal or a nitrogen and oxygen doped metal.

4. The method of claim 1, wherein the electrical conducting resistive material is composed of tantalum nitride (TaN) and the doped metallic insulator layer is composed of $Ta_3N_5$.

5. The method of claim 1, wherein the forming the liner system further comprising forming a diffusion barrier liner located beneath the metal liner.

6. The method of claim 1, wherein the metal liner is composed of ruthenium, and the layer of metal or metal alloy is composed of copper.

7. The method of claim 1, further comprising a base substrate located beneath the dielectric material layer.

8. The method of claim 1, wherein the controlled surface treatment process provides a phase change in the upper portion of the doped metallic insulator layer.

9. The method of claim 8, wherein the controlled surface treatment process comprises a thermal process, a plasma process, a gas cluster ion beam process, an ion beam process or an ion implantation process.

10. The method of claim 1, wherein after performing the planarization process, the liner system is converted into a U-shaped liner system comprising a U-shaped metal liner.

11. The method of claim 10, wherein the U-shaped liner system is located between the electrical conducting metallic structure and the dielectric material layer.

12. The method of claim 10, wherein the U-shaped metal liner is composed of ruthenium, and the electrical conducting metallic structure is composed of copper.

* * * * *